United States Patent
Suh et al.

(10) Patent No.: US 7,915,700 B2
(45) Date of Patent: Mar. 29, 2011

(54) MONOLITHIC INTEGRATED COMPOSITE DEVICE HAVING SILICON INTEGRATED CIRCUIT AND SILICON OPTICAL DEVICE INTEGRATED THEREON, AND FABRICATION METHOD THEREOF

(75) Inventors: Dongwoo Suh, Daejeon (KR); Gyungock Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 69 days.

(21) Appl. No.: 12/441,377

(22) PCT Filed: Apr. 3, 2007

(86) PCT No.: PCT/KR2007/001617
§ 371 (c)(1),
(2), (4) Date: Mar. 13, 2009

(87) PCT Pub. No.: WO2008/038873
PCT Pub. Date: Apr. 3, 2008

(65) Prior Publication Data
US 2010/0044828 A1 Feb. 25, 2010

(30) Foreign Application Priority Data
Sep. 29, 2006 (KR) .................. 10-2006-0096413

(51) Int. Cl.
*H01L 31/0232* (2006.01)
*H01L 23/58* (2006.01)
(52) U.S. Cl. .......... 257/432; 257/E23.02; 257/E31.001; 257/E31.127; 438/48
(58) Field of Classification Search .................. 257/347, 257/412, 506, E29.02, 414, 432, 431, E31.127, 257/E31.001; 438/31, 62, 481, 22, 48
See application file for complete search history.

(56) References Cited

U.S. PATENT DOCUMENTS
5,665,613 A 9/1997 Nakashima et al.
(Continued)

FOREIGN PATENT DOCUMENTS
KR 1020050043137 A 5/2005
(Continued)

OTHER PUBLICATIONS

Tejaswi Indukuri et al., "Subterranean silicon photonics: Demonstration of buried waveguide-coupled microresonators," Appl. Phys. Lett. 87, 081114 (2005).

(Continued)

*Primary Examiner* — Thomas L Dickey
*Assistant Examiner* — Nikolay Yushin (57) ABSTRACT

Provided is a monolithic integrated composite device including: a silicon substrate which is partitioned into a silicon integrated circuit forming region and a silicon optical device forming region; a buried oxide layer which is formed locally in the silicon substrate of the silicon optical device forming region and isolates unit devices of the silicon optical device forming region; an overlay layer formed locally on the buried oxide layer; a silicon optical device formed in the silicon optical device forming region using the silicon overlay layer; a silicon integrated circuit formed in the silicon integrated circuit forming region of the silicon substrate; and wiring connecting the silicon integrated circuit and the silicon optical device or connecting the silicon optical devices or connecting the silicon integrated circuits.

12 Claims, 5 Drawing Sheets

U.S. PATENT DOCUMENTS

| | | |
|---|---|---|
| 6,916,673 B2 | 7/2005 | Sieben et al. |
| 6,993,236 B1 | 1/2006 | Gunn, III et al. |
| 7,085,443 B1 * | 8/2006 | Gunn et al. ............ 385/14 |
| 2003/0142943 A1 | 7/2003 | Yegnanarayanan et al. |
| 2004/0081385 A1 * | 4/2004 | Karnacewicz et al. ...... 385/14 |
| 2005/0208694 A1 * | 9/2005 | Yue et al. ................ 438/31 |

FOREIGN PATENT DOCUMENTS

| | | |
|---|---|---|
| WO | WO 2005/020307 A1 | 3/2005 |

OTHER PUBLICATIONS

G. K. Celler, "Frontiers of silicon-on-insulator," pp. 4955-4978, J. Appl. Phys. vol. 93, No. 9, May 1, 2003.

International Search Report for application PCT/KR2007/001617 filed Apr. 3, 2007.

Written Opinion of the International Searching Authority for application PCT/KR2007/001617 filed Apr. 3, 2007.

* cited by examiner

SILICON INTEGRATED CIRCUIT FORMING REGION(200)

SILICON OPTICAL DEVICE FORMING REGION (400)

FIG. 7

SILICON INTEGRATED CIRCUIT FORMING REGION(200)

SILICON OPTICAL DEVICE FORMING REGION (400)

FIG. 8

MONOLITHIC INTEGRATED COMPOSITE DEVICE HAVING SILICON INTEGRATED CIRCUIT AND SILICON OPTICAL DEVICE INTEGRATED THEREON, AND FABRICATION METHOD THEREOF

TECHNICAL FIELD

The present invention relates to a monolithic integrated composite device and a method of fabricating the same, and more particularly, to a monolithic integrated silicon composite device in which a silicon integrated circuit and a silicon optical device are integrated and a method of manufacturing the monolithic integrated composite device.

BACKGROUND ART

Silicon nanowires are widely used in high-speed and highly-integrated electrical components and sensors. When silicon nanowires have a diameter of 10 nm or less, a quantum confinement effect occurs and thus, quick charge transfer is possible. According to the conventional art, silicon nanowires are grown on a substrate mainly using a metal catalytic layer.

Figure 1:
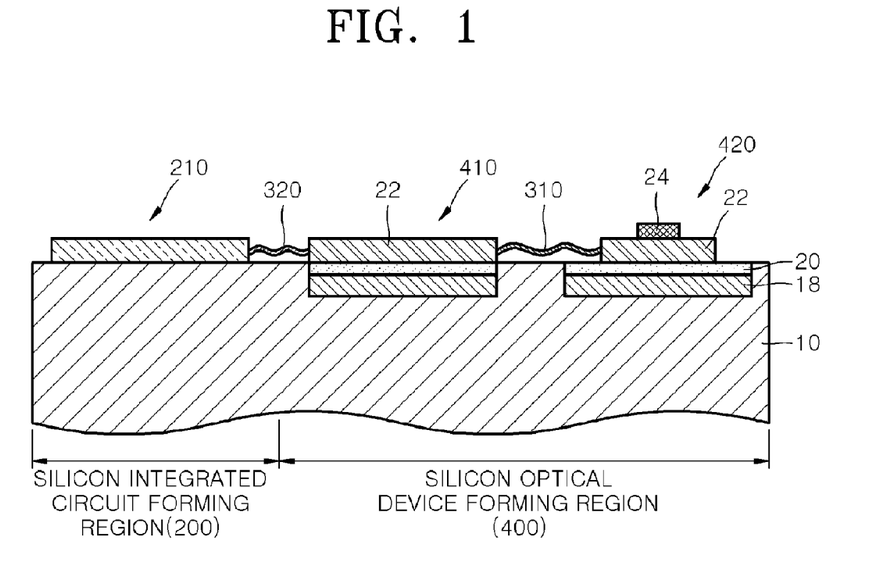
FIG. 1 is a schematic view for explaining a monolithic integrated composite device according to an embodiment of the present invention.
Figure 2:
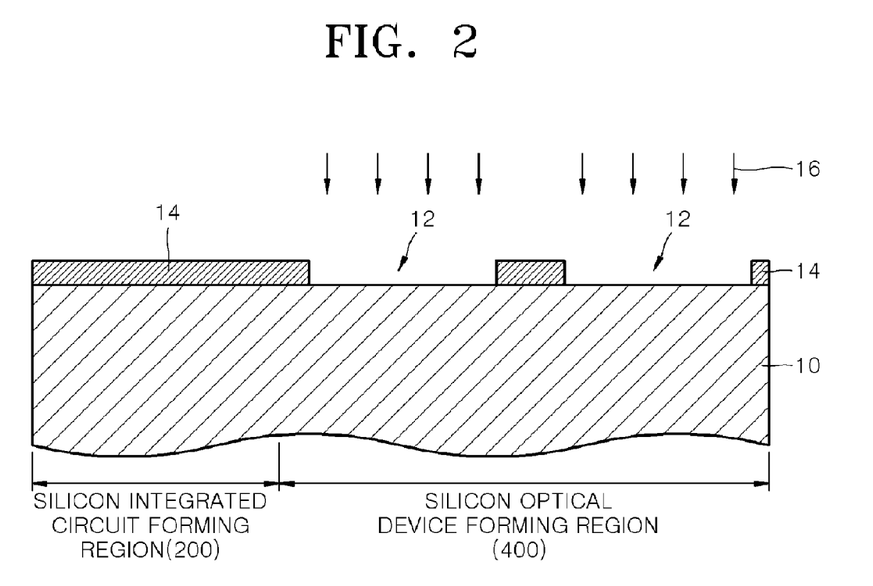
FIGS. 2 through 4 are cross-sectional views illustrating a method of manufacturing a monolithic integrated composite device according to an embodiment of the present invention.
Figure 3:
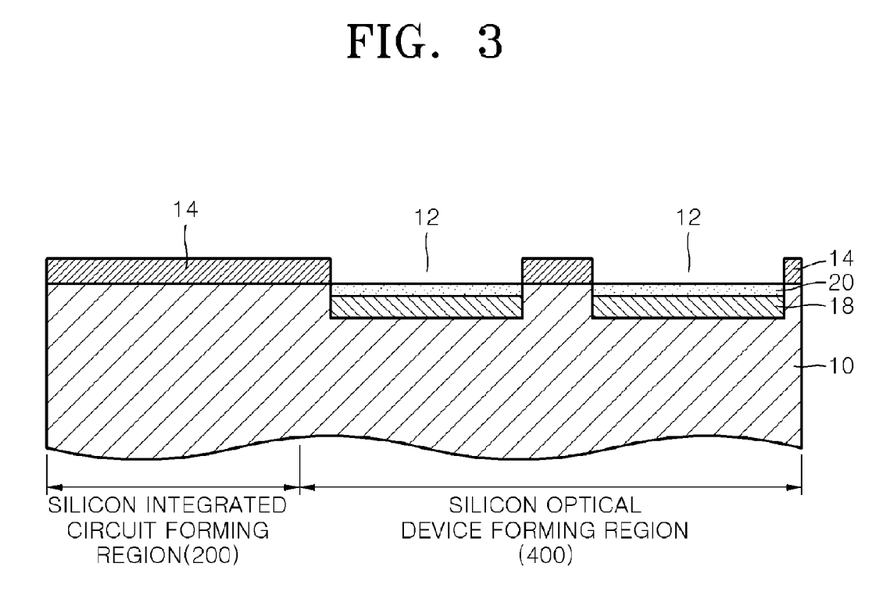

FIGS. 1 through 3 are cross sectional views illustrating a conventional method of manufacturing silicon nanowires.

Specifically, a metal catalytic layer 12, for example, a gold (Au) layer, is deposited on a substrate 10 (FIG. 1). Then the metal catalytic layer 12 is converted into catalytic metal islands 14. The catalytic metal islands 14 are self-formed at a high temperature in a nanowire growth apparatus used in a later process, for example, a thermal chemical vapor deposition apparatus. The diameter of the self-formed catalytic metal islands 14 is large, in the order of tens of nm, for example, 20 nm or larger and the areal density (number of catalytic metal islands 14 per unit area) thereof is very low, that is, $10^{10}/cm^2$ (FIG. 2).

Next, a silicon source is provided to a growth apparatus for growing silicon nanowires and silicon nanowires 16 are grown on the substrate 10 using the catalytic metal islands 14 as a catalyst. The catalytic metal islands 14 support crystal growth in the silicon nanowires 16. According to the size (diameter) of the catalytic metal islands 14, the size (diameter) of the silicon nanowires 16 is determined (FIG. 3).

A silicon integrated circuit which is included in CPU of computers or other electronic components is realized on a silicon substrate using electronic elements such as complementary metal-oxide-semiconductor (CMOS). A plurality of the silicon integrated circuits form one chip, and a plurality of the chips form a module. Signals are exchanged through metal wirings between the chips.

Since interconnection between the chips has been performed using metal wiring, the speed of signal processing has become rapid and the amount of transmitted and received information expressed by a band width has also increased rapidly. Thus along with the increasing speed of signal processing, several problems in integrated composite devices such as transmission speed, heat radiation, cross-talk, etc., have developed.

To solve the problems occurring when the chips are interconnected, application of an optical device has been suggested. Moreover, much research has been conducted on replacing optical devices formed expensive chemical compounds with cost-effective silicones. Consequently, universities, laboratories and industries have been successful in developing silicon optical devices and made them public. However, most silicon optical devices are developed as individual devices. In addition, the substrates used for the optical devices are not conventional bulk silicon substrates but mostly silicon-on-insulator (SOI) substrates.

DISCLOSURE OF INVENTION

Technical Problem

As is well known in the art, the SOI substrates basically include a buried oxide layer which is formed near the surface of the silicon substrate through several processes, and thus the cost of the SOI substrates is from several to several tens times more expensive than the bulk silicon substrates. Also, when the SOI substrates are used, the performance of a CMOS electronic element constituting most silicon integrated circuits is worse than when using bulk silicon substrates due to the crystal defects inside the SOI substrate which occur when forming a buried oxide layer.

Technical Solution

The present invention provides a monolithic integrated composite device in which a silicon integrated circuit and a silicon optical device are integrated on a silicon substrate.

The present invention also provides a method of manufacturing a monolithic integrated composite device in which a silicon integrated circuit and a silicon optical device are integrated on a silicon substrate.

According to an aspect of the present invention, there is provided a monolithic integrated composite device including a silicon substrate which is partitioned into a silicon integrated circuit forming region and a silicon optical device forming region, and a buried oxide layer which is formed locally in the silicon substrate of the silicon optical device forming region and isolates a unit device.

The monolithic integrated composite device includes a silicon overlay layer formed locally on the buried oxide layer, and a silicon optical device formed in the silicon optical device forming region using the silicon overlay layer. A silicon epilayer may be selectively formed on the silicon overlay layer, and the silicon optical device is performed using the silicon overlay layer and silicon epilayer. The silicon optical device may be comprised of at least one selected from the group consisting of an optical waveguide, a resonator, a modulator, a multiplexer, a demultiplexer, a laser diode, and a photodiode.

The monolithic integrated composite device includes a silicon integrated circuit formed in the silicon integrated circuit forming region of the silicon substrate, and a wiring connecting the silicon integrated circuit and the silicon optical device or connecting the silicon optical devices or connecting the silicon integrated circuits.

The silicon integrated circuit may be comprised of at least one selected from the group consisting of an active electronic element such as a metal-oxide-semiconductor field-effect transistor (MOSFET), a complementary metal-oxide-semiconductor (CMOS), a bipolar junction transistor (BJT) and a heterojunction bipolar transistor (HBT), a passive electronic element such as a resistor, a capacitor and an inductor, and an electronic circuit formed of the combination of active and passive electronic elements. The wiring connecting the silicon integrated circuits and the silicon optical devices, or connecting the silicon integrated circuits may be metal wiring, and the wiring connecting the silicon optical devices may be optical wiring.

According to another aspect of the present invention, there is provided a monolithic integrated composite device there is provided a monolithic integrated composite device comprising a silicon substrate which is partitioned into a silicon integrated circuit forming region and a silicon optical device forming region, a silicon integrated circuit formed in the silicon integrated circuit forming region of the silicon substrate, a silicon optical device formed in the silicon optical device forming region of the silicon substrate, a wiring connecting the silicon integrated circuit and the silicon optical device.

In the monolithic integrated composite device, a buried oxide layer is formed locally in the silicon optical device forming region of the silicon substrate and a silicon over lay layer is formed locally on the buried oxide layer. The silicon optical device may be an optical waveguide comprising the buried oxide layer as a lower clad layer, and the silicon overlay layer as a core layer, and the air on the silicon epilayer as an upper clad layer.

In the monolithic integrated composite device, a silicon epilayer may be further selectively formed on the silicon overlay layer. The silicon optical device may be an optical waveguide comprising the buried oxide layer as a lower clad layer, and at least one of the silicon overlay layer and the silicon epilayer as a core layer, and the air on the silicon epilayer as an upper clad layer.

According to another aspect of the present invention, there is provided a method of manufacturing a monolithic integrated composite device, the method comprising providing a silicon substrate which is partitioned into a silicon integrated circuit forming region and a silicon optical device forming region, forming a hard mask pattern having holes exposing at least one portion of the silicon optical device forming region of the silicon substrate. The hard mask pattern may be formed of a single layer or a dual layer formed of a metal or a dielectric material.

The method includes implanting oxygen ions to the portions of the silicon substrate exposed by the holes, forming a buried oxide layer locally to isolate a unit device in the silicon substrate by heating the oxygen ions implanted to the holes to activate the oxygen ions and forming a silicon overlay layer on the buried oxide layer. Before forming the buried oxide layer, a buffer layer pattern may be formed in the holes in order to reduce the amount of crystal defects of the silicon substrate formed during implantation of oxygen ions. After forming the silicon overlay layer, heating the silicon substrate may be formed at 800° C. to the melting point of silicon for recovery of crystallinity of the silicon overlay layer.

The method includes removing the hard mask pattern, and forming a silicon optical device in the silicon optical device forming region of the silicon substrate using the silicon overlay layer. The method includes forming a silicon integrated circuit the silicon integrated circuit forming region of the silicon substrate, and forming a wiring connecting the silicon integrated circuit and the silicon optical device, or connecting the optical devices, or connecting the silicon integrated circuits.

The method further includes selectively forming a silicon epilayer on the silicon overlay layer, and forming a silicon optical device in the silicon optical device forming region of the silicon substrate using the silicon overlay layer and silicon epilayer.

ADVANTAGEOUS EFFECTS

As described above, in the monolithic integrated composite device, a silicon integrated circuit and a silicon optical device can be monolithically integrated on a silicon substrate.

BRIEF DESCRIPTION OF THE DRAWINGS

The above and other features and advantages of the present invention will become more apparent by describing in detail exemplary embodiments thereof with reference to the attached drawings in which.

MODE FOR THE INVENTION

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, like reference numerals denote like elements, and the sizes and thicknesses of layers and regions are exaggerated for clarity.

A silicon optical device is required to be realized on a silicon substrate to be actually used in a silicon integrated circuit, and is required to be monolithically integrated on a silicon substrate. Thus the inventors have invented a monolithic integrated composite device in which a silicon integrated circuit and a silicon optical device are integrated on a silicon substrate. The silicon integrated circuit refers to a silicon substrate on which at least one electronic element is integrated. The at least one electronic element includes at least one element selected from the group consisting of an active electronic element such as MOSFET, CMOS, BJT, and HBT; a passive electronic element such as a resistor, a capacitor, and an inductor; and a combination of the active and passive electronic elements. That is, the silicon integrated circuit is integrated with one electronic element or a combination of a plurality of the electronic elements. Of course, the silicon integrated circuit includes a circuit for driving the electronic element. In addition, one silicon integrated circuit or more may be realized on the silicon substrate.

The silicon optical device includes at least one selected from the group consisting of a waveguide, a resonator, a modulator, a multiplexer, a demultiplexer, a laser diode, and a photodiode realized on a silicon substrate. That is, the silicon optical device is integrated with one electronic element or a combination of a plurality of the electronic elements. The silicon optical device includes a circuit for driving the individual optical devices. One or a plurality of the silicon optical devices may be formed. Hereinafter, a monolithic integrated composite device and a method of manufacturing the monolithic integrated composite device according to an embodiment of the present invention will be described, which can also be modified in various embodiments.

FIG. 1 is a schematic view for explaining a monolithic integrated composite device according to an embodiment of the present invention.

In detail, the monolithic integrated composite device according to the current embodiment of the present invention includes a silicon substrate 10, and a silicon integrated circuit 210 and silicon optical devices 410 and 420 integrated on the silicon substrate 10. The silicon substrate 10 is partitioned into a silicon integrated circuit forming region 200 and a silicon optical device forming region 400.

A buried oxide layer 18 separating a unit device is formed locally in the silicon optical device forming region 400 of the silicon substrate 10. A silicon overlay layer 20 is formed locally on the buried oxide layer 18. The buried oxide layer 18 is formed locally on the silicon substrate 10 through a separation by implantation of oxygen (SIMOX) process.

A silicon epilayer 22 may be further formed selectively on the silicon overlay layer 20. The silicon epilayer 22 can be formed only on the silicon overlay layer 20 using a selective epitaxial growth (SEG) method. Silicon optical devices 410 and 420 are formed on the silicon optical forming region 400 using at least one of the silicon overlay layer 20 and the silicon epilayer 22. The silicon optical devices 410 and 420 may be various forms of optical devices. Here, an optical waveguide 410 and a modulator 420 are illustrated.

Regarding the configuration of the silicon optical devices 410 and 420, the refractive index of the silicon of the silicon overlay layer 20 and the silicon epilayer 22 in the band gap energy is 3.5, the refractive index of the buried oxide layer 18 is about 1.4 to 1.5 approximately, and the refractive index of the air is approximately 1.0. Accordingly, the silicon overlay layer 20 having the largest refractive index is formed as a core, and the buried oxide layer 18 and the air are formed as clad layers to realize the optical waveguide 410. Also, at least one of the silicon overlay layer 20 and the silicon epilayer 22 having the largest refractive index is formed as a core, and the buried oxide layer 18 and the air are formed as clad layers to realize the optical waveguide 410. Specially, the silicon overlay layer 20 and the silicon epilayer 22 having the largest refractive index are formed as a core.

The air constitutes a clad layer in the current embodiment of the present invention, but an oxide layer (not shown) may be further formed as a clad layer. When an electrode 24 is attached on a silicon epilayer 22, the modulator 420 can be realized.

A silicon integrated circuit 210 is formed in the silicon integrated circuit forming region 200 of the silicon substrate 10. One or more of the silicon integrated circuits 210 may be formed, but here only one is illustrated for convenience. The silicon integrated circuit 210 and the silicon optical devices 410 and 420 are connected by wiring 310 and 320. The wiring 310 between the silicon optical devices 410 and 420 is optical wiring. In FIG. 1, the wiring 310 is shown between the silicon epilayers for convenience. The wiring 320 between the silicon integrated circuit 210 and the silicon optical devices 410 or 420 or between the silicon integrated circuits 210 is metal wiring 320. Accordingly, the silicon integrated circuit 210 and the silicon optical devices 410 and 420 are monolithically integrated on the silicon substrate 10.

Figure 4:
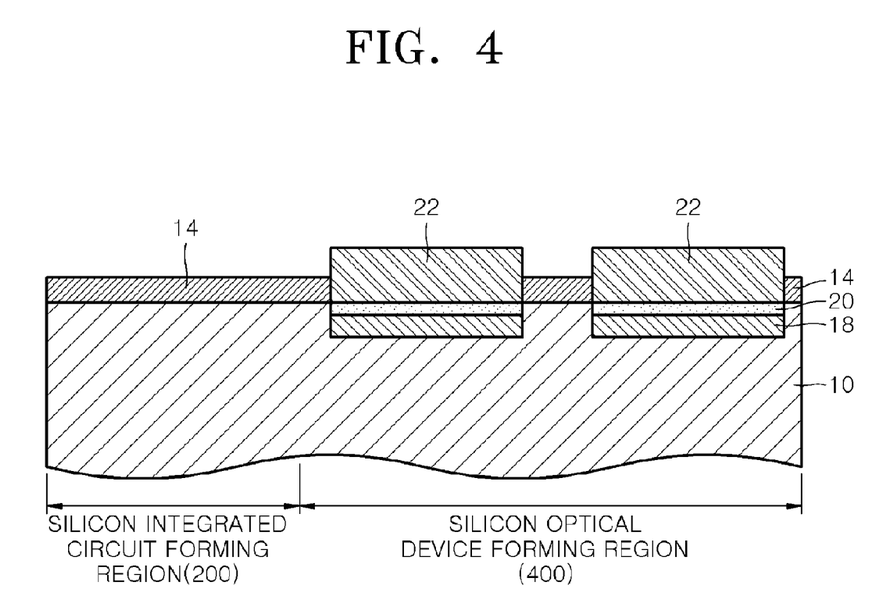

FIGS. 2 through 4 are cross-sectional views illustrating a method of manufacturing a monolithic integrated composite device according to an embodiment of the present invention.

Figure 5:
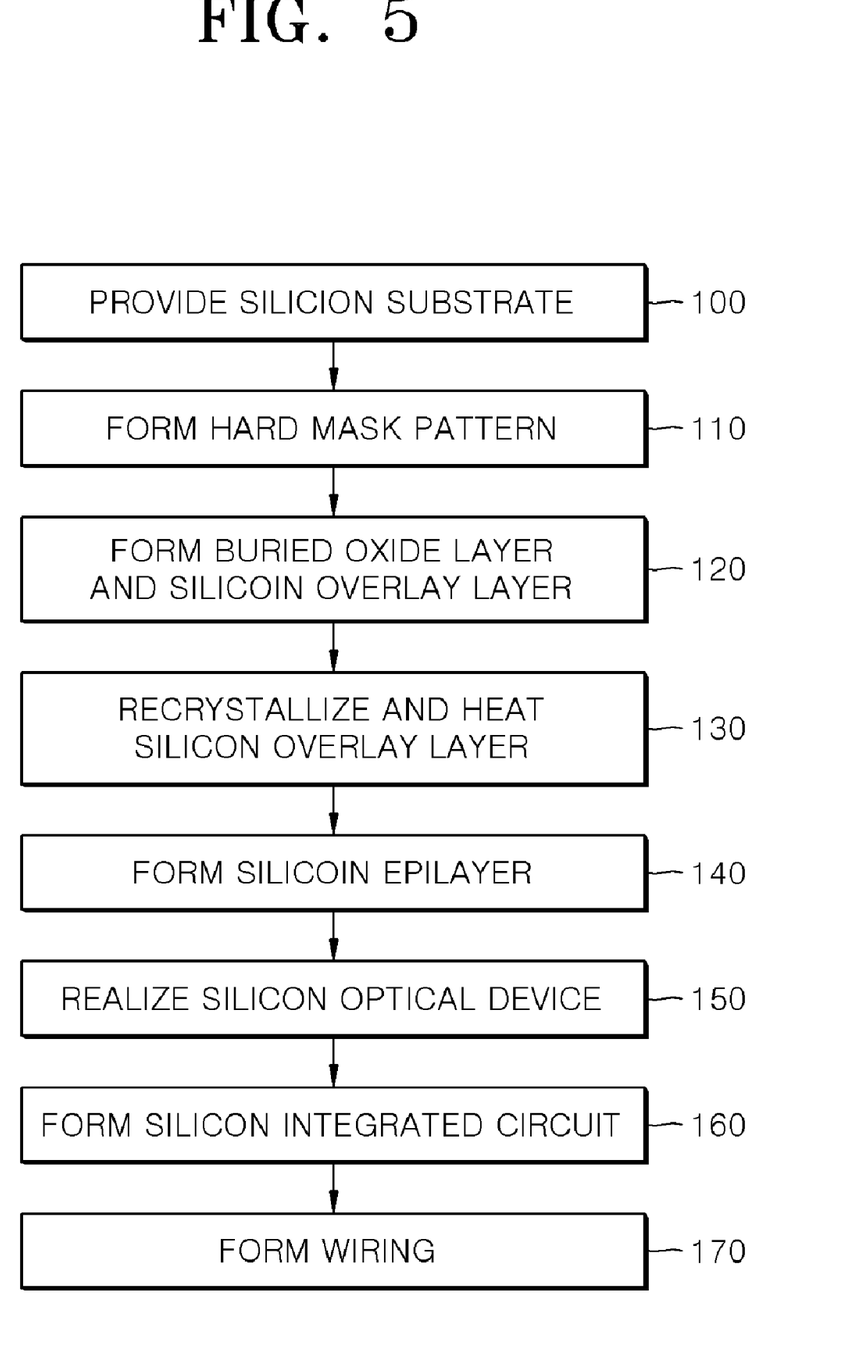
FIG. 5 is a flowchart illustrating the method of manufacturing the monolithic integrated composite with reference to FIGS. 2 through 4.

FIG. 5 is a flowchart illustrating the method of manufacturing the monolithic integrated composite with reference to FIGS. 2 through 4.

Referring to FIG. 2, a silicon substrate 10 that is partitioned into a silicon integrated circuit forming region 200 and a silicon optical device forming region 400 is provided (operation 100). Then, a hard mask pattern 14 having holes 12 exposing at least one portion of the silicon optical device forming region 400 of the silicon substrate 10 is formed (operation 110). The hard mask pattern 14 is formed by a photographic etching process using a metal layer such as chromium or aluminum, or a dielectric layer such as a silicon oxide layer or a silicon nitride layer. The holes 12 are to be implanted with oxygen ions. Oxygen ions 16 are implanted to the silicon substrate 10 in the holes 12. The implantation energy of the oxygen may be 100 to 500 keV, preferably 180 keV, and the dose amount may be $1E16/cm^2$ to $1E19/cm^2$, preferably $1E18/cm^2$.

Referring to FIG. 3, the oxygen ions implanted in the holes 12 are heated primarily to activate the oxygen ions, thereby forming a buried oxide layer 18 locally in the silicon substrate 10 to isolate a unit device, which may be an optical device (operation 120). The buried oxide layer 18 is formed locally on the silicon substrate 10 through SIMOX process. Since the buried oxide layer 18 is formed using an oxygen ion implantation process, the buried oxide layer 18 is formed below the surface of the silicon substrate 10.

The thickness of the buried oxide layer 18 and the depth to which the buried oxide layer 18 is formed in the silicon substrate are determined by the energy and the dose of the oxygen ions. A silicon overlay layer 20 is formed on the buried oxide layer when the buried oxide layer 18 is formed (operation 120). The thickness of the silicon overlay layer 20 is several tens of nanometers to submicrons, which is very thin.

Next, secondary heating (recrystallization heating) is carried out for recrystallization of the crystal defects included in the silicon overlay layer 20 by curing the silicon overlay layer 20 (operation 130). The primary heating for activation of the oxygen ions and the secondary heating for recrystallization of crystal defects of the silicon overlay layer 20 can be carried out separately. Upon necessity, the primary heating may not be carried out but oxygen ions are activated in the secondary heating process to form the buried oxide layer 18.

Hereinafter, the reason why the crystal defects are formed in the silicon overlay layer 20 and why it is advantageous to carry out recrystallization heating is explained.

Crystal defects are often generated in the silicon overlay layer 20 which remains in the process of oxygen implanting through the holes 12 of FIG. 2 because the energy of the oxygen ions is transferred to the silicon substrate 10, especially to the portions of the silicon substrate 10 exposed the holes 12 when oxygen ions 16 are implanted.

If the crystal defects included in the silicon overlay layer 20 are not recrystallized, transmission loss of light becomes very large, thereby deteriorating the optical characteristics. Also, when there are a large amount of crystal defects in the silicon overlay layer 20, it may become difficult to selectively grow a silicon epilayer 22 (of FIG. 4). Even when the silicon epilayer 22 is grown, fatal defects such as dislocation may remain in the silicon epilayer 22, thereby rapidly deteriorating the optical characteristics. Accordingly, the silicon substrate 10 in which the silicon overlay layer 20 is formed may be heated for curing the crystal defects and recrystallization.

The secondary heating is carried out by exposing the silicon substrate at 1412° C., which is the melting point of the silicon substrate (silicon), or lower, that is, 800 to 1412° C. for a long period of time. In the current embodiment of the present invention, the secondary heating is carried out by exposing the silicon substrate 10 in the range of 1300 to 1350° C. for 5 through 8 hours. The temperature and the time of the heating are in inverse proportion to each other, and thus can be modified according to the conditions. The recrystallization of the crystal defects by the secondary heating will be described in more detail with reference to FIG. 8.

Referring to FIG. 4, a silicon epilayer 22 may be selectively grown only on the silicon overlay layer 20 using a selective epitaxial growth (SEG) method (operation 140). When the silicon overlay layer 20 is very thin, for example, having a thickness of several tens of nanometers to submicrons, a silicon epilayer 22 is preferably formed on the silicon overlay layer 20. When the silicon overlay layer 20 is thick, for example, having a thickness of several micrometers, a silicon epilayer 22 is not preferably formed.

The silicon epilayer 22 is selectively grown using the SEG method. The SEG may be an evaporation deposition method using heat or electron beams, a chemical vapor deposition (CVD) method, an atomic layer deposition (ALD) method depositing on an atom basis, or a molecular beam evaporation (MBE) method depositing on a molecule basis, or any modified process of these methods.

When using the CVD method, silicon source gas such as $SiH_6$ is used and the process temperature of the chamber loaded on the silicon substrate 10 can be controlled to be in the range of 700 to 1000° C. to form a silicon epilayer 22 in an optimized condition. While or after the silicon epilayer 22 is formed, boron, phosphor, or arsenic may be doped on the silicon epilayer 22 to improve the optical and electric properties of the silicon epilayer 22.

Next, as illustrated in FIG. 1, a silicon optical device is formed on the silicon optical device forming region 400 using at least one of the silicon overlay layer 20 and the silicon epilayer 22 (operation 150). In other words, the silicon epilayer 22 is patterned using a photographic etching process to realize the structure of a silicon optical device.

Then, as illustrated in FIG. 1, a silicon integrated circuit 210 is formed in the silicon integrated circuit forming region 200 of the silicon substrate 10 (operation 160). Wirings 310 and 320 are formed to connect the silicon integrated circuit 210 and the silicon optical devices 410 and 420 to one another. The wirings 310 and 320 may be optical wirings or metal wirings depending on which devices are being connected.

In particular, the silicon integrated circuit 210 and the silicon optical devices 410 and 420 are not connected by wire bonding or flip chip bonding which requires high cost and has low efficiency, but are monolithically integrated through a continuous process on the silicon substrate 10. As described above, the silicon integrated circuit 210 and the silicon optical devices 410 and 420 are monolithically integrated on the silicon substrate 10 to complete a monolithic integrated composite device.

Referring to FIGS. 2 through 4, the silicon optical device 410 or 420 is first formed on the silicon substrate 10 and then the silicon integrated circuit 210 is formed, however, the silicon integrated circuit 210 can be first formed according to necessity, or the silicon optical device 410 or 420 and the silicon integrated circuit 210 can be formed simultaneously according to the manufacturing process. Accordingly, the monolithic integrated composite device according to the present invention can be manufactured in various manners.

Figure 6:
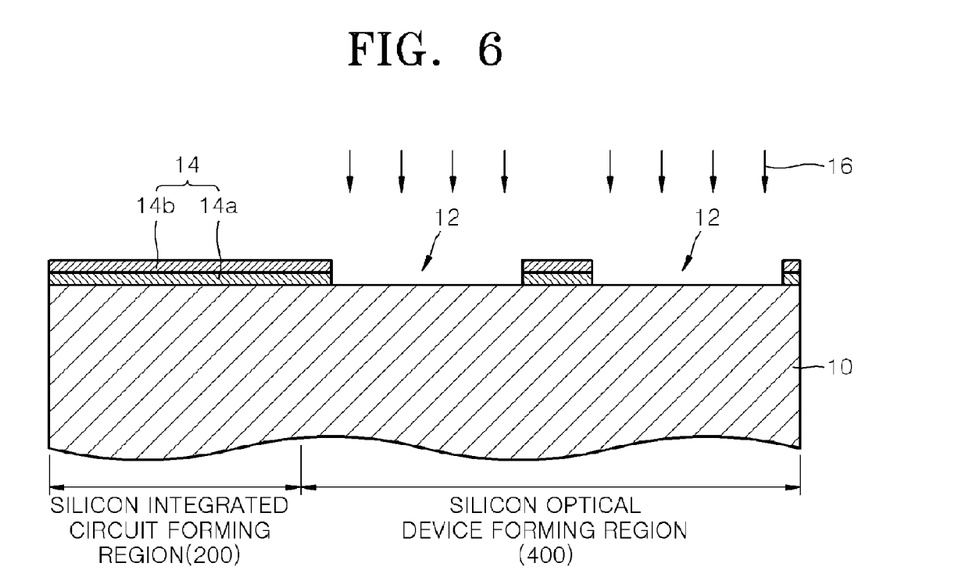
FIG. 6 is a cross-sectional view for explaining a method of manufacturing a monolithic integrated composite device according to another embodiment of the present invention.

FIG. 6 is a cross-sectional view for explaining a method of manufacturing a monolithic integrated composite device according to another embodiment of the present invention.

The method of manufacturing a monolithic integrated composite device is the same as the method illustrated with reference to FIG. 5, except that a hard mask pattern 14 is formed as a dual layer comprising a dielectric thin layer 14a and a metal layer 14b, and then oxygen ions 16 are implanted to form a buried oxide layer 18 and a silicon epilayer 20.

In detail, a hard mask pattern 14 having holes 12 exposing at least one portion of the silicon optical device forming region 400 of the silicon substrate 10 is formed. In FIG. 6, the hard mask pattern 14 is formed as a dual layer comprising a dielectric thin layer 14a and a metal layer 14b.

When the hard mask pattern 14 is formed as a single metal layer, problems such diffusion of metal atoms or contamination to the silicon substrate 10 by interaction between the silicon substrate 10 and metal atoms may occur during the growth process of the silicon epilayer 22 illustrated in FIG. 4.

When the hard mask pattern 14 is formed of a single dielectric layer, charged oxygen ions are accumulated on the dielectric thin layer during the oxygen ion implantation process illustrated in FIG. 2, and thus problem of electric charging occurs, thereby making the oxygen ion implantation process unstable. Accordingly, in the current embodiment of the present invention, the hard mask pattern 14 is formed as a dual layer comprising of a dielectric thin layer 14a and a metal layer 14b.

Next, oxygen ions 16 are implanted to the silicon substrate 10 using, as a mask, the hard mask pattern 14 formed as a dual layer comprising a dielectric thin layer 14a and a metal layer 14b. Then as illustrated in FIG. 3, a buried oxide layer 18 and a silicon overlay layer 20 are formed. Then the metal layer 14b of the hard mask pattern 14 is removed, and then recrystallization heating is carried out (operation 130 of FIG. 5). The recrystallization heating is as described with reference to FIG. 3. Then a silicon epilayer 22 is formed as described before with reference to the embodiment corresponding to FIG. 5, and then silicon optical devices 410 and 420, a silicon integrated circuit 210, and wirings 310 and 320 are formed to complete a monolithic integrated composite device.

Figure 7:
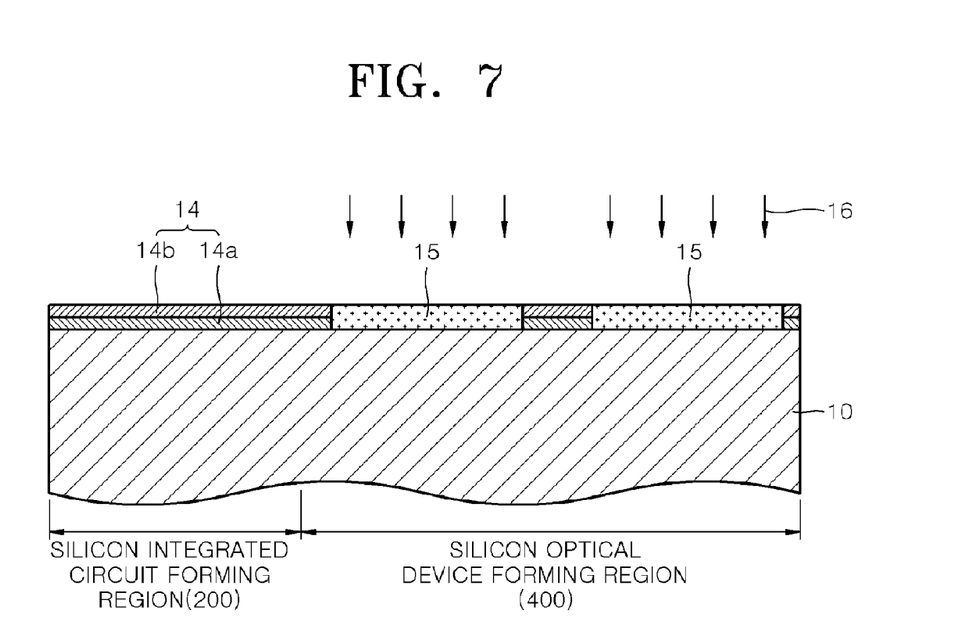
FIG. 7 is a cross-sectional view for explaining a monolithic integrated composite device according to another embodiment of the present invention.

FIG. 7 is a cross-sectional view for explaining a monolithic integrated composite device according to another embodiment of the present invention.

The method of manufacturing a monolithic integrated composite device according to the current embodiment is the same as the methods described with reference to FIGS. 5 and 6, except that a buffer layer pattern 15 is formed in the holes 12 and then oxygen ions are implanted.

In detail, as illustrated in FIG. 2, a hard mask pattern 14 having holes 12 exposing at least one portion of the silicon optical device forming region 400 of the silicon substrate 10 is formed. The hard mask pattern 14 may be formed as a single layer as illustrated in FIG. 2 or a dual layer comprising a dielectric thin layer 14a and a metal layer 14b as illustrated in FIG. 6.

Next, a buffer layer pattern 15 is formed in the holes 12. The buffer layer pattern 16 is formed to reduce damage to the silicon substrate 10 caused when oxygen ions are implanted. The buried oxide layer 18 is formed to be deeper from the surface of the silicon substrate as the energy of oxygen ions during the implantation of oxygen ions increases.

The energy of oxygen ion implantation is in the range of 100 to 500 keV. However, when the energy is 300 keV or greater, serious defects that cannot be recovered may be generated in the crystallinity of the silicon substrate 10. Thus a buffer layer pattern 15 is formed in the current embodiment of the present invention in order to reduce the energy of the oxygen ion implantation.

The buffer layer pattern 15 may be formed of any material, preferably of a silicon oxide layer in consideration of contamination to the silicon substrate 10. Using the buffer layer pattern 15, the depth of the buried oxide layer 18 can be controlled.

Next, oxygen ions 16 are implanted using the hard mask pattern 14 as a mask in FIG. 7. Then as illustrated in FIG. 3, a buried oxide layer 18 and a silicon overlay layer 20 are formed. Then the metal layer 14b of the hard mask pattern 14 is removed to carry out recrystallization heating. The recrystallization heating is as described with reference to FIG. 3.

Next, as described with reference to the embodiment regarding FIG. 5, a silicon epilayer 22 is formed, and then silicon optical devices 410 and 420, a silicon integrated circuit 210 and wirings 310 and 320 are formed to complete a monolithic integrated composite device.

Figure 8:
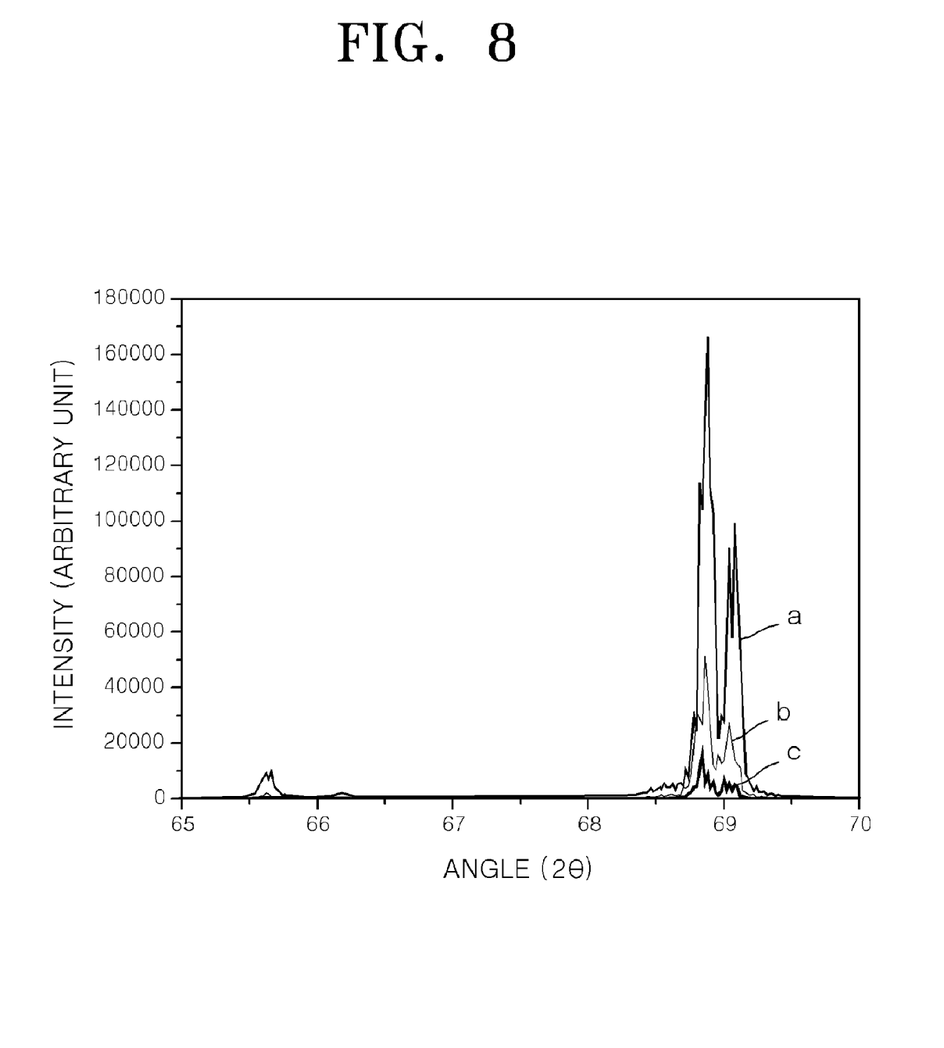
FIG. 8 is an X-ray diffraction graph illustrating the crystal state of a silicon substrate before and after implantation of oxygen ions during manufacturing of the monolithic integrated composite device according to the present invention.

FIG. 8 is an X-ray diffraction graph illustrating the crystal state of a silicon substrate before and after implantation of oxygen ions during manufacturing of the monolithic integrated composite device according to the present invention.

In FIG. 8, a indicates the case of a silicon substrate to which no oxygen ions are implanted, c indicates to the case of a silicon substrate to which oxygen ions are implanted, and b indicates to the case of a silicon substrate to which oxygen ions are implanted and then recrystallization heating is carried out. The oxygen ions are implanted having the energy of 350 keV and at a dose amount of $5E16/cm^2$, and the recrystallization heating is carried out at 1350° C. for 5 hours. As illustrated in FIG. 8, the crystallinity of the silicon substrate is significantly weakened by the ion implantation but is considerably recovered by the recrystallization heating.

As described above, the present invention provides a monolithic integrated composite device in which a silicon integrated circuit and silicon optical devices are integrated to overcome the limitations in signal processing and transmission speed. The monolithic integrated composite device is monolithically integrated on a substrate not by wiring bonding or flip chip bonding which requires high cost and has low efficiency but by a continuous process.

In addition, according to the present invention, silicon optical devices are realized by forming a buried oxide layer locally on a silicon substrate through SIMOX process, and a silicon integrated circuit is monolithically integrated in a portion of the silicon substrate where the buried oxide layer is not formed. Accordingly, optical devices formed mainly of compound semiconductor are monolithically integrated on a silicon substrate which is highly cost-effective and the performance of the silicon integrated circuit can be maintained as well.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

The present invention provides a monolithic integrated composite device and a method of fabricating the same, The present invention provides a monolithic integrated silicon composite device in which a silicon integrated circuit and a silicon optical device are integrated and a method of manufacturing the monolithic integrated composite device.

The invention claimed is:

1. A monolithic integrated composite device comprising:
a silicon substrate which is partitioned into a silicon integrated circuit forming region and a silicon optical device forming region;
a buried oxide layer which is formed locally over the silicon substrate of the silicon optical device forming region and configured to isolate a unit device;
a silicon overlay layer formed locally over the buried oxide layer;
a silicon optical device formed over the silicon optical device forming region using the silicon overlay layer;
a silicon integrated circuit formed over the silicon integrated circuit forming region of the silicon substrate; and
a wiring configured to connect the silicon integrated circuit and the silicon optical device, to connect the silicon optical devices, or to connect the silicon integrated circuits.

2. The monolithic integrated composite device of claim 1, wherein the silicon optical device comprises at least one selected from the group consisting of an optical waveguide, a resonator, a modulator, a multiplexer, a demultiplexer, a laser diode, and a photodiode.

3. The monolithic integrated composite device of claim 1, wherein the silicon integrated circuit includes at least one selected from the group consisting of an active electronic element, a passive electronic element, and an electronic circuit including one or more active electronic elements and one or more passive electronic elements, the active electronic element including a metal-oxide-semiconductor field-effect transistor (MOSFET), a complementary metal-oxide-semiconductor (CMOS), a bipolar junction transistor (BJT) and a heterojunction bipolar transistor (HBT), the passive electronic element including a resistor, a capacitor and an inductor.

4. The monolithic integrated composite device of claim 1, wherein the wiring connecting the silicon integrated circuits and the silicon optical devices, or connecting the silicon integrated circuits is metal wiring, and the wiring connecting the silicon optical devices is optical wiring.

5. The monolithic integrated composite device of claim 1, wherein a silicon epilayer is selectively formed on the silicon overlay layer.

6. A monolithic integrated composite device comprising:
a silicon substrate which is partitioned into a silicon integrated circuit forming region and a silicon optical device forming region;
a silicon optical device formed over the silicon optical device forming region of the silicon substrate; and
a wiring connecting the silicon integrated circuit and the silicon optical device,
wherein a buried oxide layer is formed locally over the silicon optical device forming region of the silicon substrate, and a silicon overlay layer is formed locally over the buried oxide layer.

7. The monolithic integrated composite device of claim 6, wherein the silicon optical device is an optical waveguide comprising the buried oxide layer as a lower clad layer, the silicon overlay layer as a core layer, and the air adjacent to the silicon overlay layer as an upper clad layer.

8. The monolithic integrated composite device of claim 6, wherein a silicon epilayer is selectively formed on the silicon overlay layer, and the silicon optical device is an optical waveguide comprising the buried oxide layer as a lower clad layer, at least one of the silicon overlay layer and the silicon epilayer as a core layer, and the air over the silicon epilayer as an upper clad layer.

9. A method of manufacturing a monolithic integrated composite device, the method comprising:
providing a silicon substrate having a silicon integrated circuit forming region and a silicon optical device forming region;
forming a hard mask pattern having holes exposing at least one portion of the silicon optical device forming region of the silicon substrate;
implanting oxygen ions to the portions of the silicon substrate exposed by the holes;
forming a local buried oxide layer over the silicon optical device forming region of the silicon substrate by heating the oxygen ions implanted in the holes;
forming a silicon overlay layer over the local buried oxide layer;
removing the hard mask pattern;
forming a silicon optical device over the local buried oxide layer provided over the silicon optical device forming region of the silicon substrate using the silicon overlay layer;
forming a silicon integrated circuit over the silicon integrated circuit forming region of the silicon substrate; and
forming a wiring connecting the silicon integrated circuit and the silicon optical device, or connecting the silicon optical device to another silicon optical device, or connecting the silicon integrated circuit to another silicon integrated circuit.

10. The method of claim 9, wherein before forming the local buried oxide layer, a buffer layer pattern is formed in the holes in order to reduce the amount of crystal defects of the silicon substrate formed during implantation of oxygen ions.

11. The method of claim 9, wherein the hard mask pattern is formed of a single layer or a dual layer formed of a metal or a dielectric material.

12. The method of claim 9, comprising heating the silicon substrate to a temperature between 800° C. and the melting point of silicon for recovery of crystallinity of the silicon overlay layer after forming the silicon overlay layer.

* * * * *